United States Patent
Jang et al.

(10) Patent No.: US 7,791,682 B2
(45) Date of Patent: Sep. 7, 2010

(54) DISPLAY DEVICE

(75) Inventors: Jin Seok Jang, Ulsan-si (KR); Jae Ho Jung, Ulsan-si (KR); Yong Seok Kim, Ulsan-si (KR); Hyo Shin Song, Ulsan-si (KR); Hwan Soo Lim, Ulsan-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 639 days.

(21) Appl. No.: 11/603,191

(22) Filed: Nov. 22, 2006

(65) Prior Publication Data

US 2007/0115625 A1    May 24, 2007

(30) Foreign Application Priority Data

Nov. 23, 2005    (KR) ..................... 10-2005-0112574

(51) Int. Cl.
    *G02F 1/1333*    (2006.01)
(52) U.S. Cl. .......................................... 349/58; 349/60
(58) Field of Classification Search ................... 349/58, 349/60
    See application file for complete search history.

(56) References Cited

U.S. PATENT DOCUMENTS

| | | | |
|---|---|---|---|
| 6,172,731 B1 | 1/2001 | Nagano et al. | |
| 7,075,241 B2 * | 7/2006 | Kim et al. | 315/169.3 |
| 7,130,185 B2 * | 10/2006 | Chen et al. | 361/679.3 |
| 2004/0036396 A1 | 2/2004 | Kang et al. | |
| 2004/0179151 A1 * | 9/2004 | Lee | 349/58 |
| 2004/0195969 A1 | 10/2004 | Kim et al. | |
| 2005/0231659 A1 | 10/2005 | Lee | 349/58 |
| 2006/0055839 A1 | 3/2006 | Hirao et al. | |
| 2006/0066771 A1 * | 3/2006 | Hayano et al. | 349/58 |
| 2009/0290089 A1 * | 11/2009 | Ichioka et al. | 349/58 |

FOREIGN PATENT DOCUMENTS

| | | |
|---|---|---|
| JP | 2003-288802 | 10/2003 |
| KR | 1020040097092 | 11/2004 |
| WO | WO 98/27799 | 6/1998 |

* cited by examiner

*Primary Examiner*—Hemang Sanghavi
(74) *Attorney, Agent, or Firm*—Lee & Morse, P.C.

(57) ABSTRACT

A display device which may include a bottom chassis receiving a display panel, at least one printed circuit board mounting parts for controlling the display panel, and a reinforcing chassis attached to the printed circuit board.

18 Claims, 3 Drawing Sheets

DISPLAY DEVICE

BACKGROUND OF THE INVENTION

1. Field of the Invention

The present invention relates to a display device. More particularly, the present invention relates to a flat panel display device with improved rigidity.

2. Discussion of Related Art

In recent years, various types of display devices have been developed with an aim towards reducing their weight and volume. Some examples of the emissive display devices include, for example, a cathode ray tube (CRT), a Field Emission Display (FED), a Plasma Display Panel (PDP), a Light Emitting Display (LED) and the like. An example of a non-emissive display device includes, for example, a Liquid Crystal Display (LCD), Despite the variety of display devices that may exist, the flat panel display has gained acceptance as an alternative means to the CRT display. A possible impetus for this trend may relate to the light-weight, low power consumption, thinness and miniaturization of flat panel displays, such as the LCD and LED. Currently, the LCD has been employed not only with portable devices, such as a cellular phones and personal digital assistants (PDAs), but also with mid to large size devices, such as monitors and televisions.

FIG. 1 illustrates a rear perspective view of a display device. The display device may include a bottom chassis 10, in which a display panel may be received, a mold frame 20, and a printed circuit board 30 mounted with various parts 35 and a connector 32. The printed circuit board 30 may be positioned on the rear side of the bottom chassis 10.

The bottom chassis 10 may combine with the mold frame 20 and may receive and protect the display panel. The bottom chassis 10 may be formed of materials such as, for example, stainless steel. The connector 32 mounted on the printed circuit board 30, may also be connected to a driving circuit of a device, for example, a cellular phone (not illustrated), in order to receive a driving signal from the driving circuit of the device. Of course, a variety of devices other than the cellular phone may be considered and is only used herein for purposes of discussion and illustration. In response to the driving signal, the printed circuit board may generate various control signals. The control signals may be supplied to other necessary components, so that a predetermined image may be displayed by the display device. For example, if a LCD is employed, the control signals may be supplied to a backlight unit, which may be found in the mold frame 20 and the bottom chassis 10. Of course, if for example, an organic light-emitting diode (OLED) display is employed, a backlight unit may not be required.

As with almost any display device, it may be exposed to the environment and may be affected by external impacts, which may result in damage and failure of the display device, including damage to the display panel, which may be attached to the mold frame 20. In the exemplary display device discussed above, the printed circuit board 30 may be formed of a flexible material. Accordingly, external impacts may affect the printed circuit board 30 and cause the printed circuit board 30 to bend and/or become damaged. Thus, if the printed circuit board 30 becomes damaged, the display device may no longer function properly. In order to prevent this from occurring, it may be necessary to prevent the printed circuit board 30 from becoming damaged and a need exists to improve the overall rigidity of a display device.

SUMMARY OF THE INVENTION

The present invention is therefore directed to a display device, which substantially overcomes one or more of the problems due to the limitations and disadvantages of the related art.

It is therefore a feature of an exemplary embodiment of the present invention to provide a display device which may prevent the printed circuit board from becoming bent or damaged and may improve the rigidity of the display device.

It is another feature of an exemplary embodiment of the present invention to provide a display device improving rigidity without increasing thickness of the display device.

At least one of the above and other features and advantages of the present invention may be realized by providing a display device, including a display panel, a bottom chassis formed to receive the display panel, a printed circuit board which may include parts for controlling the display panel, and a reinforcing chassis attached to the printed circuit board.

The reinforcing chassis may be formed with at least one opening portion to accommodate parts which may be mounted on the printed circuit board. The thickness of the reinforcing chassis may be equal to or less than a part having a maximum thickness among the parts. The thickness of the reinforcing chassis may be in the range of about 0.1 mm to about 1 mm.

The reinforcing chassis may be made of a rigid material. The display panel may be a flat display panel.

At least one of the above and other features and advantages of the present invention may also be realized by providing a display device, including a display panel, a chassis configured to receive the display panel, a printed circuit board configured to drive the display panel; and a reinforcing chassis attached to the printed circuit board.

The reinforcing chassis may be attached to the printed circuit board on a rear side.

The printed circuit board may include a connector. The printed circuit board may be configured to receive signals from another device via the connector. The received signals may be used to drive the display panel and display images.

At least one of the above and other features and advantages of the present invention may also be realized by providing a display device, including a display panel, a chassis configured to receive the display panel, a printed circuit board configured to receive signals from another device in order to drive the display panel; and a reinforcing chassis attached to the printed circuit board.

The reinforcing chassis may not add to an overall thickness of the chassis and the printed circuit board, individually or collectively.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2005-112574, filed on Nov. 23, 2005, in the Korean Intellectual Property Office, and entitled: "Portable Display Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. Hereinafter, exemplary embodiments of the present invention, wherein a person having ordinary skill in the art can carry out the present invention, will be described in a more detailed manner with reference to the accompanying FIG. 2 and FIG. 3.

Figure 1:
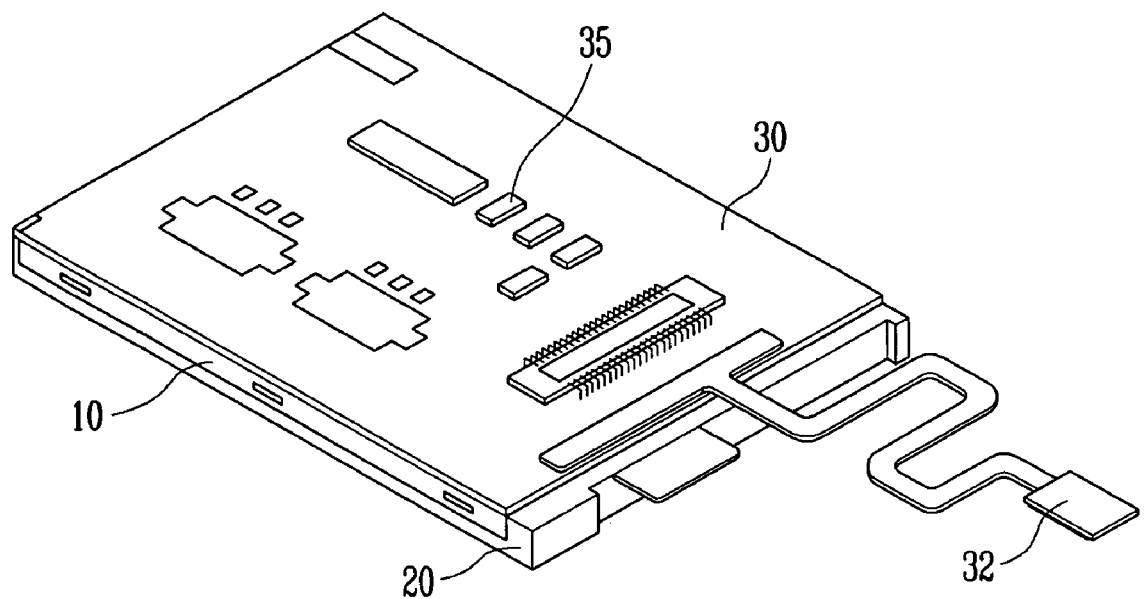
FIG. 1 illustrates a rear perspective view of a display device.
Figure 2:
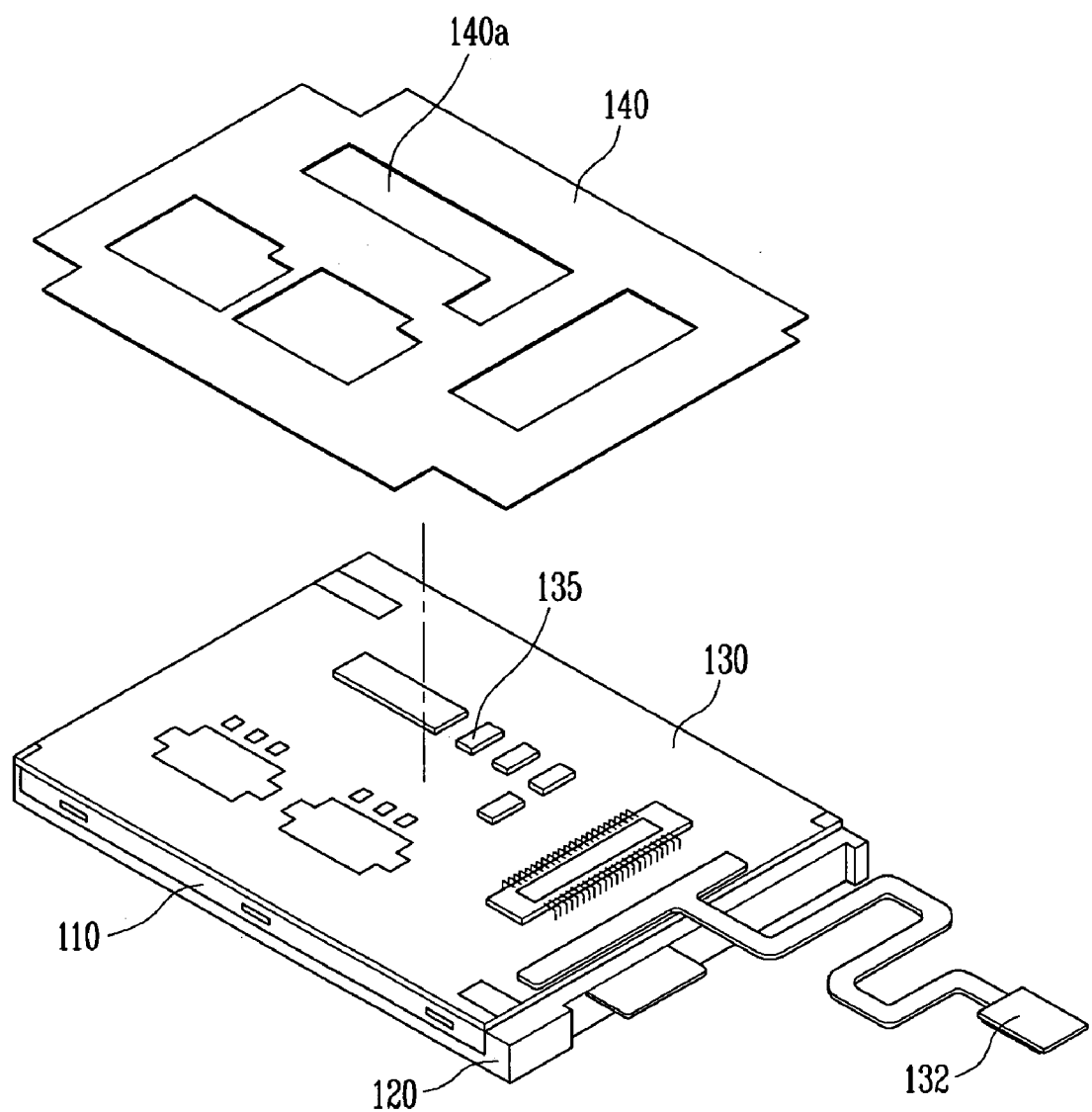
FIG. 2 illustrates an exploded rear perspective view of a display device according to an exemplary embodiment of the present invention.
Figure 3:
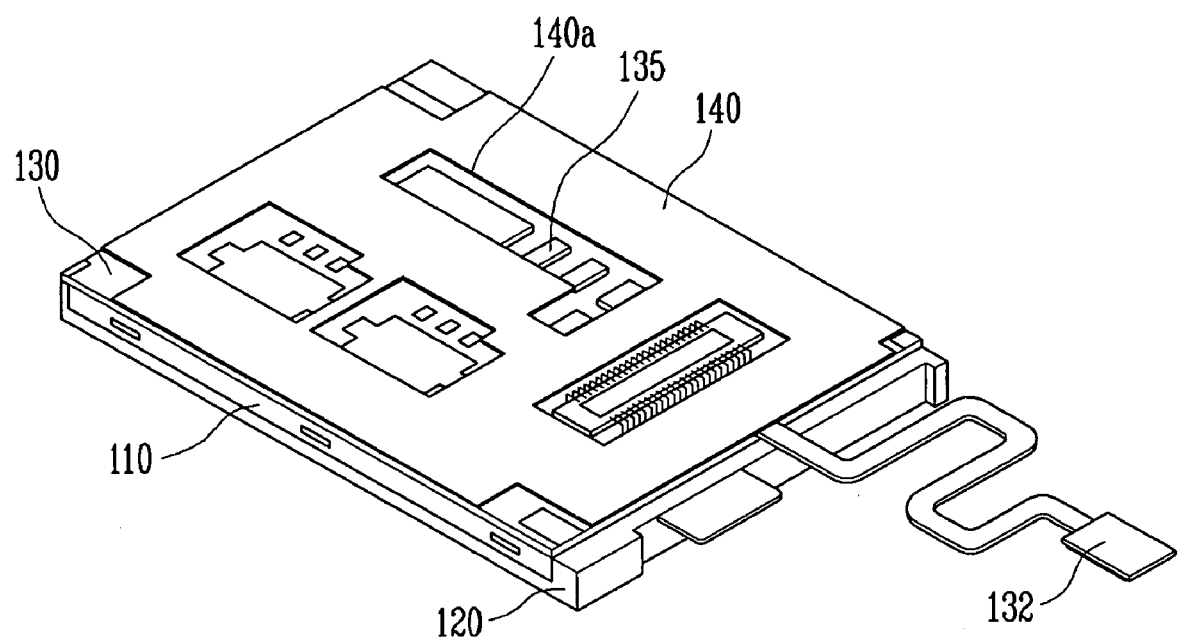
FIG. 3 illustrates a rear perspective view of a coupling state of the display device illustrated in FIG. 2.

FIG. 2 illustrates an exploded rear perspective view of a display device according to an exemplary embodiment of the present invention. FIG. 3 illustrates a rear perspective view of a, coupling state of the display device illustrated in FIG. 2. The exemplary display device of FIG. 2 and FIG. 3 is not limited to one display, but may include one or more mounted displays.

Referring to FIG. 2 and FIG. 3, the display device according to an exemplary embodiment of the present invention may include a bottom chassis 110 that may receive a display panel, a printed circuit board 130, which may be positioned on the rear side of the bottom chassis 110, and a reinforcing chassis 140. Although not illustrated, the bottom chassis 110 may be configured to receive other necessary components associated with the display panel. Those skilled in the art recognize the distinctions between various display panels and what other components may be received by the bottom chassis 110. For example, the display device may be an LCD and a backlight may be a component received by the bottom chassis 110. The display device may also include a mold frame 120, which may further house the display panel and other components.

The bottom chassis 110 may receive and protect the display panel, and may be formed of stainless steel or other suitable material. The bottom chassis 110 may also be joined with the mold frame 120. The printed circuit board 130 may be mounted with various parts 135, and may include a connector, for example, a device connector 132. The device connector 132 may connect to a driving circuit of a device so that it may receive a driving signal from the driving circuit of the device. The device (not illustrated) may be, for example, a cellular phone, a PDA, a computer, a DVD player, a monitor, a television, or the like. The device connector 132 may supply the printed circuit board 130 with the driving signal, which, in turn, may generate various control signals. The control signals that may be generated from the printed circuit board 130 may be supplied to other necessary components (not illustrated), so that a predetermined image may be displayed by the display device.

In order to prevent external impacts from causing damage to the printed circuit board 130 and the display panel, an exemplary embodiment of the display device may further include the reinforcing chassis 140. The reinforcing chassis 140 may be formed of a material such as stainless steel or other suitable material.

In one implementation, as illustrated in FIG. 2 and FIG. 3, the reinforcing chassis may attach to the rear side of the printed circuit board 130. The reinforcing chassis 140 may attach to the printed circuit board 130 by using, e.g., an adhesive member, such as an adhesive tape or some other suitable technique. The reinforcing chassis 140 may be formed with an opening portion 140a corresponding to the region on which the parts 135 of the printed circuit board 130 may be mounted. That is, when the printed circuit board 130 is attached to the reinforcing chassis 140, the parts 135 mounted on the printed circuit board 130 may be positioned in the opening portion 140a of the reinforcing chassis 140. The thickness of the reinforcing chassis 140 may be set equal to or less than the part having a maximum thickness among the parts 135. Hence, the entire thickness of the display device may not be increased despite the addition of the reinforcing chassis 140. For example, the thickness of the reinforcing chassis 140 may be in the approximate range of 0.1 mm to 1 mm.

Although only one printed circuit board 130 is illustrated in FIG. 2 and FIG. 3, more than one printed circuit board may actually be mounted on top of the bottom chassis 110. Accordingly, in another implementation (not illustrated), in the case of multiple printed circuit boards, there may be multiple reinforcing chassis 140 to accommodate the multiple printed circuit boards. Alternately, a single reinforcing chassis 140 may be configured with respective opening parts 140a to accommodate multiple printed circuit boards.

In another implementation (not illustrated), the rear side of the reinforcing chassis 140 may be further mounted with at least one display panel. In this case, the printed circuit board 130 and the reinforcing chassis 140 may be formed with an opening portion corresponding to the display panel mounted on the rear side.

According to an exemplary embodiment of the present invention, the display device may further include the reinforcing chassis 140 on a side of the printed circuit board 130 on which the parts 135 may be mounted so as to prevent the printed circuit board 130 from being bent and improve the rigidity of the entire display device. Also, the thickness of the reinforcing chassis 140 may be equal to or less than that of the part having a maximum thickness among the parts 135. Additionally, a region of the reinforcing chassis 140 may be formed with the opening part 140a so that the entire thickness of the display device may not be increased.

According to an exemplary embodiment of the display device, the reinforcing chassis may be mounted on the rear side of the printed circuit board, thereby preventing the printed circuit board from being bent and improving the rigidity of the entire display device. Also, the parts of the printed circuit board may be positioned in the opening portion of the reinforcing chassis and the thickness of the reinforcing chassis may be set to be equal to or less than that of the part having a maximum thickness. Hence, the entire thickness of the display device may not be increased despite improving the rigidity of the display device, which may be desirable for many applications, including portable display devices.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A display device, comprising:
   a display panel;
   a bottom chassis and a mold frame formed to receive the display panel;
   a printed circuit board including parts for controlling the display panel; and
   a reinforcing chassis, made of a rigid material, that is attached to the printed circuit board, extending substantially across a rear side of the printed circuit board and being above the bottom chassis and the mold frame.

2. The display device as claimed in claim 1, wherein the reinforcing chassis is formed with at least one opening portion to accommodate the parts mounted on the printed circuit board.

3. The display device as claimed in claim 1, wherein the thickness of the reinforcing chassis is in the range of about 0.1 mm to about 1 mm.

4. The display device as claimed in claim 1, wherein the display panel is a flat display panel.

5. The display device as claimed in claim 1, wherein the reinforcing chassis is attached to the rear side of the printed circuit board and extends across an entire side of the display panel and across an entire side of the printed circuit board.

6. The display device as claimed in claim 1, wherein:
   the mold frame surrounds the bottom chassis, and
   at least one lateral sidewall of the reinforcing chassis is vertically aligned with a sidewall of the bottom chassis.

7. A display device, comprising:
   a display panel;
   a chassis and a mold frame configured to receive the display panel;
   a printed circuit board configured to drive the display panel; and
   a reinforcing chassis, made of a rigid material, that is attached to the printed circuit board and is above the chassis and the mold frame.

8. The display device as claimed in claim 7, wherein the reinforcing chassis is attached to the printed circuit board on a rear side.

9. The display device as claimed in claim 8, wherein the printed circuit board includes a connector.

10. The display device as claimed in claim 9, wherein the printed circuit board is configured to receive signals from another device via the connector.

11. The display device as claimed in claim 10, wherein the received signals can be used to drive the display panel and display images.

12. The display device as claimed in claim 7, wherein the reinforcing chassis is formed with at least one opening portion to accommodate parts mounted on the printed circuit board.

13. The display device as claimed in claim 7, wherein the reinforcing chassis is attached to a rear side of the printed circuit board and extends across an entire side of the display panel and across an entire side of the printed circuit board.

14. The display device as claimed in claim 7, wherein:
   the mold frame surrounds the chassis, and
   at least one lateral sidewall of the reinforcing chassis is vertically aligned with a sidewall of the chassis.

15. A display device, comprising:
   a display panel;
   a chassis and a mold frame configured to receive the display panel;
   a printed circuit board, wherein the printed circuit board is configured to receive signals from another device in order to drive the display panel; and
   a reinforcing chassis, made of a rigid material, that is attached to the printed circuit board and is above the chassis and the mold frame.

16. The display device as claimed in claim 15, wherein the reinforcing chassis is formed with at least one opening portion to accommodate parts mounted on the printed circuit board.

17. The display device as claimed in claim 15, wherein the reinforcing chassis is attached to a rear side of the printed circuit board and extends across an entire side of the display panel and across an entire side of the printed circuit board.

18. The display device as claimed in claim 15, wherein:
   the mold frame surrounds the chassis, and
   at least one lateral sidewall of the reinforcing chassis is vertically aligned with a sidewall of the chassis.

* * * * *